(12) United States Patent
Park et al.

(10) Patent No.: US 11,708,644 B2
(45) Date of Patent: Jul. 25, 2023

(54) METHOD FOR PREPARING SIC INGOT, METHOD FOR PREPARING SIC WAFER AND THE SIC WAFER PREPARED THEREFROM

(71) Applicant: SENIC INC., Cheonan-si (KR)

(72) Inventors: Jong Hwi Park, Suwon-si (KR); Myung-Ok Kyun, Suwon-si (KR); Jongmin Shim, Hwaseong-si (KR); Byung Kyu Jang, Suwon-si (KR); Jung Woo Choi, Suwon-si (KR); Sang Ki Ko, Suwon-si (KR); Kap-Ryeol Ku, Suwon-si (KR); Jung-Gyu Kim, Suwon-si (KR)

(73) Assignee: SENIC INC., Cheonan-si (KR)

( * ) Notice: Subject to any disclaimer, the term of this patent is extended or adjusted under 35 U.S.C. 154(b) by 436 days.

(21) Appl. No.: 16/917,541

(22) Filed: Jun. 30, 2020

(65) Prior Publication Data

US 2021/0123160 A1    Apr. 29, 2021

(30) Foreign Application Priority Data

Oct. 29, 2019  (KR) ........................ 10-2019-0135346

(51) Int. Cl.
  *C30B 29/36* (2006.01)
  *B24B 7/22* (2006.01)
  *B28D 5/00* (2006.01)
  *C30B 23/02* (2006.01)
  *C01B 32/956* (2017.01)
  (Continued)

(52) U.S. Cl.
  CPC .............. *C30B 29/36* (2013.01); *B24B 7/228* (2013.01); *B28D 5/00* (2013.01); *C01B 32/956* (2017.08); *C30B 23/02* (2013.01); *B28D 5/022* (2013.01); *B28D 5/045* (2013.01); *H01L 29/1608* (2013.01)

(58) Field of Classification Search
  CPC ........ B24B 7/228; B28D 5/022; B28D 5/045; C01B 32/956; C30B 29/36; C30B 23/02; H01L 29/1608
  See application file for complete search history.

(56) References Cited

U.S. PATENT DOCUMENTS

| | | | |
|---|---|---|---|
| 2010/0051961 A1* | 3/2010 | Kuraoka | H01L 29/66462 257/E29.104 |
| 2013/0143173 A1 | 6/2013 | Goshe et al. | |
| 2017/0321345 A1 | 11/2017 | Xu et al. | |

FOREIGN PATENT DOCUMENTS

| | | |
|---|---|---|
| CN | 1282770 C | 11/2006 |
| CN | 101724893 A | 6/2010 |

(Continued)

OTHER PUBLICATIONS

Korean Notice of Allowance dated Jul. 26, 2021 in counterpart Korean Patent Application No. 10-2019-0135346 (2 pages in English and 6 pages in Korean).

*Primary Examiner* — Jaehwan Oh
(74) *Attorney, Agent, or Firm* — NSIP Law (57) ABSTRACT

A method for preparing a SiC ingot includes: preparing a reactor by disposing a raw material in a crucible body and disposing a SiC seed in a crucible cover, and then wrapping the crucible body with a heat insulating material having a density of 0.14 to 0.28 g/cc; and growing the SiC ingot from the SiC seed by placing the reactor in a reaction chamber and adjusting an inside of the reactor to a crystal growth atmosphere such that the raw material is vapor-transported and deposited to the SiC seed.

7 Claims, 3 Drawing Sheets

(51) Int. Cl.
 B28D 5/02 (2006.01)
 B28D 5/04 (2006.01)
 H01L 29/16 (2006.01)

(56) References Cited

FOREIGN PATENT DOCUMENTS

| | | |
|---|---|---|
| JP | 2001-114599 A | 4/2001 |
| JP | 2008-110907 A | 5/2008 |
| JP | 2009-256145 A | 11/2009 |
| JP | 2011-111372 A | 6/2011 |
| JP | 2011-219296 A | 11/2011 |
| JP | 2013-082629 A | 5/2013 |
| JP | 2013-147425 A | 8/2013 |
| JP | 2014-221711 A | 11/2014 |
| JP | 2015-63435 A | 4/2015 |
| JP | 2015-514673 A | 5/2015 |
| JP | 2015-120616 A | 7/2015 |
| JP | 2016-37441 A | 3/2016 |
| JP | 2017-114728 A | 6/2017 |
| JP | 2018-184324 A | 11/2018 |
| KR | 10-2012-0024767 A | 3/2012 |
| KR | 10-2012-0082873 A | 7/2012 |
| KR | 10-2012-0139398 A | 12/2012 |
| KR | 10-1253205 B1 | 4/2013 |
| KR | 10-2014-0110266 A | 9/2014 |
| KR | 10-2014-0126371 A | 10/2014 |
| KR | 10-1537385 B1 | 7/2015 |
| KR | 10-2016-0055102 A | 5/2016 |
| KR | 10-2017-0012272 A | 2/2017 |
| KR | 10-2017-0041223 A | 4/2017 |
| KR | 10-1760030 B1 | 7/2017 |
| KR | 10-2017-0126789 A | 11/2017 |
| KR | 10-1823216 B1 | 1/2018 |
| KR | 10-2018-0037204 A | 4/2018 |
| TW | 200425286 A | 11/2004 |
| TW | 200845167 A | 11/2008 |
| WO | WO 2014/123036 A1 | 8/2014 |
| WO | WO 2014/137072 A1 | 9/2014 |
| WO | WO 2016/006442 A1 | 1/2016 |
| WO | WO 2019/176444 A1 | 9/2019 |

\* cited by examiner

METHOD FOR PREPARING SIC INGOT, METHOD FOR PREPARING SIC WAFER AND THE SIC WAFER PREPARED THEREFROM

CROSS-REFERENCE TO RELATED APPLICATIONS

This application claims the benefit under 35 U.S.C. 119(a) of Korean Patent Application No. 10-2019-0135346 filed on Oct. 29, 2019, in the Korean Intellectual Property Office, the entire disclosure of which is incorporated herein by reference for all purposes.

BACKGROUND

1. Field

The present disclosure relates to a method for preparing a SiC ingot, a method for preparing a SiC wafer and the SiC wafer prepared therefrom.

2. Description of the Background

Single crystals of silicon carbide (SiC), silicon (Si), gallium nitride (GaN), sapphire ($Al_2O_3$), gallium arsenide (GaAs) and aluminum nitride (AlN) have characteristics that cannot be expected from their respective polycrystals, such that demands for their single crystals in the industrial field are increasing.

Single crystal SiC has a large energy band gap and its break field voltage and thermal conductivity are superior to silicon (Si). In addition, the carrier mobility of single crystal SiC is comparable to that of silicon, and the saturation drift rate and breakdown voltage of electrons are also large. Due to such characteristics, single crystal SiC is expected to be applied to semiconductor devices requiring high efficiency, high breakdown voltage and high capacity.

As methods for preparing a SiC single crystal, there are Liquid Phase Epitaxy (LPE), Chemical Vapor Deposition (CVD), seed sublimation method, and the like. Among them, a seed sublimation method is most widely used because it can produce ingot shaped SiC with a high growth rate and is also called a Physical Vapor Transport (PVT).

Japanese Patent Publication No. 2001-114599 discloses a method for growing a single crystal ingot on a seed crystal as follows: while heating a seed crystal by a heater in a vacuum vessel (heating furnace), into which argon gas can be introduced, a temperature of the seed crystal is maintained at a temperature of 10 to 100° C. lower than a temperature of the raw material powder such that the single crystal ingots grow on the seed crystal. In addition, there are attempts to produce single crystal ingots having large diameter without substantial defects.

The above information is presented as background information only to assist with an understanding of the present disclosure. No determination has been made, and no assertion is made, as to whether any of the above might be applicable as prior art with regard to the disclosure.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

In one general aspect, a method for preparing a SiC ingot includes: preparing a reactor by disposing a raw material in a crucible body and disposing a SiC seed in a crucible cover, and then wrapping the crucible body with a heat insulating material having a density of 0.14 to 0.28 g/cc; and growing the SiC ingot from the SiC seed by placing the reactor in a reaction chamber and adjusting an inside of the reactor to a crystal growth atmosphere such that the raw material is vapor-transported and deposited to the SiC seed.

The heat insulating material may have an air porosity of 72 to 95%.

The heat insulating material may include a carbon-based felt.

The heat insulating material may have a compressive strength of 0.2 Mpa or more.

The heat insulating material may have a thickness of 20 mm to 150 mm.

The crystal growth atmosphere may have a temperature of 2000 to 2500° C. and a pressure of 1 to 200 torr.

In another general aspect, a method for preparing a SiC wafer includes: slicing the SiC ingot applying an off angle selected from 0 to 15 degree based on a (0001) plane of the SiC ingot to prepare a sliced crystal of the SiC ingot; and grinding the sliced crystal to form the SiC wafer.

The SiC wafer may include: a plurality of measuring points distributed on a surface of the wafer at regular intervals of 10 mm or less; and a target area on the surface of the wafer inside of a circle having a radius of 70% of a radius of the wafer; wherein the plurality of measuring points are within the target area, wherein a rocking curve of the plurality of measuring points has a peak and a full width at half maximum, wherein an average value of an omega angle is an average of omega angles of the peaks of the plurality of measuring points, wherein the full width at half maximum is a value based on the average value of the omega angle, and wherein more than 95% of the plurality of measuring points have the full width at half maximum of −1.5 to 1.5 degree.

More than 96% of the plurality of measuring points may have the full width at half maximum of −1.0 to 1.0 degree.

More than 97% of the plurality of measuring points may have the full width at half maximum of −0.5 to 0.5 degree.

More than 98% of the plurality of measuring points may have the full width at half maximum of −0.05 to 0.05 degree.

Less than 5% of the plurality of measuring points may have the full width at half maximum of less than −1.5 degree or more than 1.5 degree.

The target area may include one or more measuring point per 1 $cm^2$.

The target area may be an area inside of a circle having a radius of 80% of the radius of the wafer.

The SiC wafer may include: a plurality of measuring points distributed on a surface of the wafer at regular intervals of 10 mm or less; and a target area on the surface of the wafer inside of a circle having a radius of 70% of a radius of the wafer; wherein the plurality of measuring points are within the target area, wherein a rocking curve of the plurality of measuring points has a peak and a full width at half maximum, wherein an omega angle of one of the plurality of measuring points is an omega angle measured at the peak of the one of the plurality of measuring points, and wherein a first measuring point is a measuring point having a maximum omega angle, a second measuring point is a measuring point having a minimum omega angle, and a difference between the omega angle of the first measuring point and the omega angle of the second measuring point is 0.5 degree or less.

Other features and aspects will be apparent from the following detailed description, the drawings, and the claims.

BRIEF DESCRIPTION OF THE DRAWINGS

Throughout the drawings and the detailed description, the same reference numerals refer to the same elements. The drawings may not be to scale, and the relative size, proportions, and depiction of elements in the drawings may be exaggerated for clarity, illustration, and convenience.

DETAILED DESCRIPTION

The following detailed description is provided to assist the reader in gaining a comprehensive understanding of the methods, apparatuses, and/or systems described herein. However, various changes, modifications, and equivalents of the methods, apparatuses, and/or systems described herein will be apparent after an understanding of this disclosure. For example, the sequences of operations described herein are merely examples, and are not limited to those set forth herein, but may be changed as will be apparent after an understanding of this disclosure, with the exception of operations necessarily occurring in a certain order. Also, descriptions of features that are known in the art may be omitted for increased clarity and conciseness.

The features described herein may be embodied in different forms and are not to be construed as being limited to the examples described herein. Rather, the examples described herein have been provided merely to illustrate some of the many possible ways of implementing the methods, apparatuses, and/or systems described herein that will be apparent after an understanding of this disclosure. Hereinafter, while embodiments of the present disclosure will be described in detail with reference to the accompanying drawings, it is noted that examples are not limited to the same.

Throughout the specification, the phrase that a certain element "comprises" or "includes" another element means that the certain element may further include one or more other elements but does not preclude the presence or addition of one or more other elements, unless stated to the contrary.

Throughout the specification, when a composition is "connected" to another composition, this includes not only 'directly connected' but also 'connected with another composition in the middle.'

Spatially relative terms such as "above," "upper," "below," and "lower" may be used herein for ease of description to describe one element's relationship to another element as shown in the figures. Such spatially relative terms are intended to encompass different orientations of the device in use or operation in addition to the orientation depicted in the figures. For example, if the device in the figures is turned over, an element described as being "above" or "upper" relative to another element will then be "below" or "lower" relative to the other element. Thus, the term "above" encompasses both the above and below orientations depending on the spatial orientation of the device. The device may also be oriented in other ways (for example, rotated 90 degrees or at other orientations), and the spatially relative terms used herein are to be interpreted accordingly.

Throughout the specification, the term "combination of" included in Markush type description means mixture or combination of one or more elements described in Markush type and thereby means that the disclosure includes one or more elements selected from the Markush group.

Throughout the specification, description of "A and/or B" means "A, B, or A and B."

Throughout the specification, terms such as "first", "second" or "A", "B" are used to distinguish the same terms from each other, unless the context clearly indicates otherwise.

Throughout the specification, the articles "a," "an," and "the" are intended to include the plural forms as well, unless the context clearly indicates otherwise.

An aspect of the present disclosure is to provide a method for preparing a SiC ingot, a method for preparing a SiC wafer and the SiC wafer prepared therefrom, which can precisely control the temperature gradient of crystal growth and provide a single crystal SiC wafer with superior characteristics.

Figure 3:
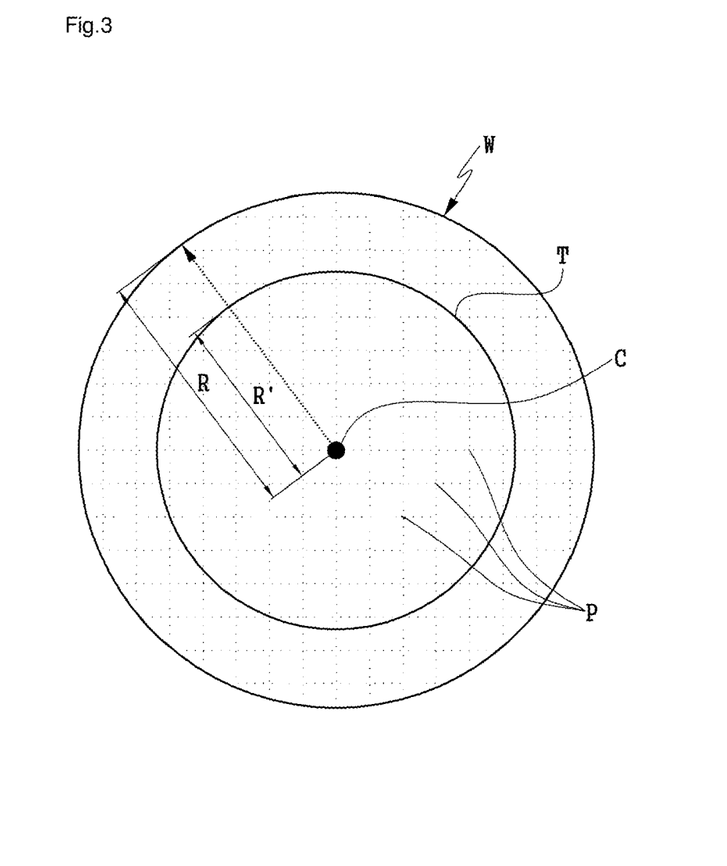
FIG. 3 is a conceptual view illustrating a target area T and a measuring point P in the wafer W according to an embodiment.

FIG. 3 is a conceptual view illustrating a target area T and a measuring point P on the wafer W according to an embodiment. Hereinafter, the example embodiments will be described in more detail.

The SiC wafer W according to an embodiment has an off angle of 0 to 15 degree based on a (0001) plane.

On the surface of the SiC wafer W, there are a plurality of measuring points P spaced apart by regular intervals of 10 mm or less within the target area.

The SiC wafer W includes the target area T, which is an inner area of an area having a radius R' of 70% of the radius R of the wafer from the center C of the wafer. That is, the target area is an area corresponding to the inside of a circle that shares the center of the wafer and has a radius of 70% of the radius of the wafer.

The center of the wafer means the geometric center of the wafer, and if the shape of the wafer observed from an upper side of the wafer is substantially a circle, it means the center of the circle. If the shape of the wafer is an ellipse, the average value of the long radius and short radius is referred to the radius.

The wafer has the radius R of a substantially constant size from the center to the outer direction, the target area also has the radius R' of a substantially constant size from the center to the outer direction, the radius R' may be 70% of the radius R.

A rocking curve measured at a measuring point P has a peak and a full width at half maximum.

An average value of an omega angle is an average of omega angles of the peaks of the measuring points in the target area.

A full width at half maximum is a value based on the average value of the omega angle.

More than 95% of the plurality of measuring points may have the full width at half maximum of −1.0 to 1.0 degree.

That is, the rocking curves of the plurality of the measuring points may have a full width at half maximum, and more than 95% of the plurality of measuring points in the target area may have the full width at half maximum of −1.5 to 1.5 degree.

The quality of a SiC ingot can be evaluated by measuring a value of a full width at half maximum based on a peak angle in a rocking curve of a wafer. Usually, 5 or 9 points are measured over a large area of the wafer to obtain an average of the full width at half maximum. It was confirmed that it is necessary to manage a full width at half maximum over an entire area of a wafer in order to maintain better quality of the wafer.

In the present disclosure, the following method is disclosed:

i) A target area is set on one surface of a wafer, and a plurality of measuring points are designated by spacing them apart at regular intervals;

ii) An omega angle of the rocking curve at each measuring point is measured to determine an average value of the omega angles. The measurement of the omega angle is to reduce an influence of a shift in a reference angle, which can occur when an angle of a substrate is twisted. The full width at half maximum at each measuring point is evaluated based on the average value of the omega angles;

iii) The ratio of the measuring points, which have the full width at half maximum below or above a certain degree, based on the total measuring points, is determined.

The surface of the wafer is divided by a plurality of imaginary lines intersecting each other and having a constant interval of at or below 10 mm, and a plurality of points where each line intersect is designated as measuring points. Referring to FIG. 3, the plurality of imaginary lines are illustrated as orthogonal, in order to set a relatively constant distance between the measuring points adjacent to each other, but are not limited thereto.

The target area may include more than one measuring point per 1 cm$^2$.

The target area may include 1 to 20 measuring point per 1 cm$^2$.

More than 96% of the plurality of measuring points may have the full width at half maximum of −1.0 to 1.0 degree.

More than 97% of the plurality of measuring points may have the full width at half maximum of −0.5 to 0.5 degree.

More than 98% of the plurality of measuring points may have the full width at half maximum of −0.05 to 0.05 degree.

Less than 5% of the plurality of measuring points may have the full width at half maximum of less than −1.5 degree or more than 1.5 degree.

As described above, the full width at half maximum is based on an average value of the omega angle of the measuring point in the target area.

The full width at half maximum of the rocking curve is evaluated as follows: A direction of the wafer [11-20] is aligned with a X-ray path of a high resolution X-ray diffraction analysis system (HR-XRD system); setting angles of the X-ray source optic and the X-ray detector optic to 2θ (35 to 36 degrees); the rocking curve is determined by controlling an omega (ω, or theta θ, X-ray detector optic) angle to correspond to the off angle of the wafer; and the crystallinity is evaluated from the locking angle, which is obtained from a difference between the peak angle, which is a reference angle, and two full width at half maximum (FWHM).

An off angle of X degree means that it has an off angle determined as X degree within a general error range, and for example, it includes an off angle in a range of (X−0.05 degree) to (X+0.05 degree).

A full width at half maximum "−1 to +1 degree relative to the reference angle" means that the full width at half maximum is in the range of (peak angle−1 degree) to (peak angle+1 degree) with respect to the reference angle. The reference angle is the omega angle at the peak. In an embodiment, the reference angle when describing the full width at half maximum in the target area is an average of the omega angles of the peaks of the measuring points within the target area.

The SiC wafer is obtained from a SiC ingot.

The SiC wafer may be any one of wafers having an off angle selected in a range of 0 to 15 degree with respect to a (0001) plane (SiC (004) plane or (006) plane) of the SiC ingot. The SiC wafer may be any one of wafers having an off angle selected in a range of 0 to 8 degree with respect to a (0001) plane (SiC (004) plane or (006) plane) of the SiC ingot.

The omega angle may be 17.8111 degree when the off angle is 0 degree, the omega angle may be 13.811 degree when the off angle is 4 degree, and the omega angle may be 9.8111 degree when and the off angle is 8 degree. The omega angles of the wafers with the off angle of 0 to 8 degree may be in a range of 9.8111 to 17.8111 degree.

The SiC ingot contains 4H SiC, and may have a convex or flat surface.

The SiC ingot may be a 4H—SiC ingot, which is substantially a single crystal whose defects and polymorphic mixing are minimized.

The SiC ingot is substantially made of a 4H SiC, whose surface may be convex or flat.

If the shape of the surface of the SiC ingot is unintentionally formed as concave, it may be because an unintended crystal having different polymorphism such as 6H—SiC is mixed with the intended 4H—SiC crystal, and it may cause deterioration of the quality of the SiC ingot. In addition, when the surface of the SiC ingot is formed as excessively convex, cracks may occur in the ingot itself or crystal may be broken during wafer processing.

Whether the SiC ingot is formed as excessively convex is determined based on a degree of warpage, and the SiC ingot prepared according to the present disclosure has the degree of warpage of 15 mm or less.

The degree of warpage is determined as follows. The sample, whose growth of the SiC ingot has been completed, is placed on a surface plate, heights of a center and an edge of the ingot are measured with a height gauge based on a back surface of the ingot, and the degree of warpage is determined by subtracting the height of the edge from the height of the center. A positive value for the degree of warpage means convexity, 0 means flatness, and a negative value for the degree of warpage means concavity.

The SiC ingot may have a surface having a convex shape or a flat shape and the degree of warpage may be 0 to 15 mm, 0 to 12 mm, or 0 to 10 mm. The SiC ingot having such degree of warpage is easier to be processed into wafers and may reduce occurrence of cracks.

The SiC ingot may have reduced defects, which may occur in a conventional SiC ingot, thereby providing a SiC wafer having higher quality.

The SiC ingot may be a 4H—SiC ingot, which is substantially a single crystal.

The diameter of the SiC ingot may be 4 inches or more, specifically, 5 inches or more, more specifically 6 inches or more. Still more specifically, the diameter of the SiC ingot may be 4 inches to 12 inches, 4 inches to 10 inches, or 6 inches to 8 inches.

A suitable SiC seed may be applied depending on the characteristics of the ingot.

A SiC ingot may be grown on the C plane (0001) of the SiC seed.

The target area may be an area corresponding to the inside of a circle having a radius of 80% of the radius of the wafer.

The target area may be an area corresponding to the inside of a circle having a radius of 90% of the radius of the wafer.

An omega angle of a measuring point is an omega angle of the peak of the measuring point.

A first measuring point is a measuring point having a maximum omega angle among the peaks of the measuring point. A second measuring point is a measuring point having a minimum omega angle among the peaks of the measuring point.

A difference between the minimum value and the maximum value of the omega angle of the peak among the rocking curves of the measuring points measured in the target area may be 0.5 degrees or less. That is, a difference between the omega angle of the first measuring point and the omega angle of the second measuring point in the target area may be within 0.5 degrees.

A difference between the minimum value and the maximum value of the omega angle of the peak among the rocking curves of the measuring points measured in the target area may be 0.35 degrees or less. That is, a difference between the omega angle of the first measuring point and the omega angle of the second measuring point in the target area may be within 0.35 degrees.

A difference between the minimum value and the maximum value of the omega angle of the peak among the rocking curves of the measuring points measured in the target area may be 0.25 degrees or less. That is, a difference between the omega angle of the first measuring point and the omega angle of the second measuring point in the target area may be within 0.25 degrees.

A difference between the minimum value and the maximum value of the omega angle of the peak among the rocking curves of the measuring points measured in the target area may be 0 degree or more, or 0.000001 degree or more.

The omega angle of each peak in the rocking curves of the measuring points measured in the target area may be in a range from 13.7 to 14.2 degree.

The omega angle of each peak in the rocking curves of the measuring points measured in the target area may be in a range from 13.75 to 14.10 degree.

The omega angle of each peak in the rocking curves of the measuring points measured in the target area may be in a range from 13.8 to 14.05 degree.

The ingot having these characteristics has excellent crystalline properties.

A method for preparing a wafer according to an embodiment includes a slicing step and a grinding step.

The slicing step is a step of preparing a sliced crystal by slicing the SiC ingot to have a constant off angle.

The off angle is based on the (0001) plane in 4H SiC.

The off angle may be an angle selected from 0 to 15 degree, an angle selected from 0 to 12 degree, or an angle selected from 0 to 8 degree.

The slicing may be performed by a slicing method that is conventionally used in the manufacture of a wafer. For example, cutting with a diamond wire or a wire to which a diamond slurry is applied, and cutting with a blade or a wheel to which a diamond is partially applied, may be used, but is not limited thereto.

The thickness of the sliced crystal may be adjusted considering the thickness of the wafer to be manufactured, and may be sliced to an appropriate thickness considering the thickness of the wafer after ground in the grinding step described as follows.

The grinding step is a step of forming a SiC wafer by grinding the sliced crystal to form the SiC wafer. The thickness of the wafer may be 300 to 800 μm.

In the grinding step, a grinding method, which is conventionally used in the manufacture of a wafer, may be used. For example, after processes such as lapping and/or grinding or the like, polishing or the like may be performed.

The SiC wafer is a wafer with an off angle of an angle selected from 0 to 15 degree based on the (0001) plane, and includes a target area sharing a center of the wafer and having a radius of 70% or more of the radius of the wafer. In addition, it includes a plurality of measuring points spaced apart on the surface of the wafer at regular intervals of 10 mm or less.

A rocking curve measured at the measuring point has a peak and a full width at half maximum.

The full width at half maximum is a value based on the average value of the omega angle.

More than 95% of the plurality of measuring points may have the full width at half maximum of −1.5 to 1.5 degree.

An omega angle of a measuring point is an omega angle at the peak of the measuring point.

A first measuring point is a measuring point having a maximum omega angle among the peaks of the measuring point, A second measuring point is a measuring point having a minimum omega angle among the peaks of the measuring point.

A difference between the omega angle of the first measuring point and the omega angle of the second measuring point in the target area of the SiC wafer may be within 0.5 degree.

Descriptions for the SiC ingot and the SiC wafer, such as the full width at half maximum and the omega angle of the peak, are same as described above, and thus description thereof is omitted.

The SiC ingot may be prepared by a method for a manufacturing a SiC ingot.

The method for manufacturing the SiC ingot includes a preparation step to prepare a reactor and a growth step to produce a SiC ingot.

The preparation step is a step of preparing a reactor by disposing a raw material in a crucible body and disposing a SiC seed in a crucible cover, and then wrapping the crucible body with a heat insulating material having a density of 0.14 to 0.28 g/cc.

The reactor may be used as long as it is capable of growing an ingot, and specifically, a graphite crucible may be used.

For example, the reactor may include a crucible body having an internal space for receiving a raw material therein and an opening, and a crucible cover covering the opening of the crucible body.

The crucible cover may further include a seed holder integrally or separately from the crucible cover, and a SiC seed is placed at the seed holder.

The reactor is wrapped and fixed by a heat insulating material, the heat insulating material surrounding the reactor is placed in a reaction chamber such as a quartz tube, then the temperature inside the reactor can be controlled by a heating means surrounding the reaction chamber.

The growth of a SiC ingot may vary depending on the size and type of the crucible body, the crucible cover, and the raw material to be loaded, and the quality of an ingot may also vary depending on the temperature gradient inside the crucible body in the growth atmosphere. Thus, the quality of an ingot may vary depending on the degree of heat insulation of the reactor, and the heat insulating material also plays an important role, because the temperature gradient inside the crucible body or inside the reactor in the growth atmosphere may vary depending on the heat insulating material.

The heat insulating material of an embodiment may have a density of 0.14 to 0.28 g/cc, 0.14 to 0.24 g/cc, or 0.14 to 0.19 g/cc.

When the density of the heat insulating material is less than 0.14 g/cc, the shape of the grown ingot may be concave, and 6H—SiC polymorphism may occur such that the quality of the ingot may deteriorate.

When the density of the heat insulating material is more than 0.28 g/cc, the shape of the grown ingot may be excessively convex, and the growth rate of the edge may be lowered, such that the yield of the ingot may decrease or crack generation of the ingot may increase.

When the density of the heat insulating material is from 0.14 to 0.24 g/cc, it is possible to improve the quality of the ingot. Further, when the density of the heat insulating material is from 0.14 to 0.19 g/cc, it is possible to control the crystal growth atmosphere during the ingot growth process and to grow an ingot of higher quality.

The heat insulating material may have an air porosity of 72 to 95%, 75 to 93%, 80 to 91%, or 80 to 85%. When applying the heat insulating material having such an air porosity, the frequency of ingot cracking can be further reduced.

The heat insulating material may have a compressive strength of 0.2 Mpa or more, 0.48 Mpa or more, or 0.8 MPa or more. The heat insulating material may have a compressive strength of 3 MPa or less, or 2.5 MPa or less. When the heat insulating material has these compressive strengths, the thermal/mechanical stability of the heat insulating material is excellent, and the possibility of occurrence of ash is reduced, such that a SiC ingot having a higher quality can be produced.

The heat insulating material may include a carbon-based felt, specifically, a graphite felt, and more specifically, a rayon-based graphite felt or a pitch-based graphite felt.

The heat insulating material may have a thickness of 20 mm or more, or 30 mm or more. In addition, the heat insulating material have a thickness of 150 mm or less, 120 mm or less, or 80 mm or less.

When the heat insulating material having such a thickness, it is possible to sufficiently obtain an insulating effect without unnecessarily wasting the heat insulating material.

In the growth step, the reactor is placed in the reaction chamber and the internal space of the reactor is adjusted to a crystal growth atmosphere such that the raw material is vapor-transported and deposited to the SiC seed, and the SiC ingot grown from the SiC seed is prepared.

The crystal growth atmosphere may be created from heating the crucible or the internal space of the crucible by the heating means outside the reaction chamber. The growth of the SiC crystal may be induced under reduced pressure and/or an inert atmosphere (e.g., an Ar atmosphere, an N2 atmosphere, or a mixed atmosphere thereof) by simultaneously or separately reducing the pressure with the heating to remove air.

The crystal growth atmosphere causes sublimation and recrystallization of the raw materials in a high temperature atmosphere to grow the ingot.

The crystal growth atmosphere may have a growth temperature of 2000 to 2500° C. and a growth pressure of 1 to 200 torr. When such temperature and pressure are applied, the SiC ingot can be more efficiently manufactured.

Specifically, the crystal growth atmosphere may have the growth temperature that the upper and lower surface temperature of the crucible is 2100 to 2500° C., and the growth pressure of 1 to 50 torr. More specifically, it may have the growth temperature that the upper and lower surface temperature of the crucible is 2150 to 2450° C., and the growth pressure of 1 to 40 torr. Still more specifically, it may have the growth temperature that the upper and lower surface temperature of the crucible is 2150 to 2350° C., and the growth pressure of 1 to 30 torr.

When the crystal growth atmosphere described above is applied, it is more advantageous to manufacture a SiC ingot having higher quality.

Different SiC seeds may be used depending on the characteristics of the SiC ingot to be grown. For example, 4H—SiC wafer, 6H—SiC wafer, 3C—SiC wafer, 15R—SiC wafer, etc. may be used, but is not limited thereto.

Different SiC seeds may be used depending on the size of the SiC ingot to be grown. The raw material may be a powder form having a carbon source and a silicon source. The powder may be raw materials necked to each other or a SiC powder having a carbonized surface such that the powders are connected with each other.

The raw material is sublimated in the crystal growth atmosphere and moves to the SiC seed, and is recrystallized from the seed to form the SiC ingot.

A SiC wafer obtained by applying an off angle of 0 to 15 degree based on the (0001) plane from the SiC ingot has the characteristics described above. Descriptions for the SiC wafer are same as described above, and thus description thereof is omitted. The SiC ingot, the SiC wafer, and the like have excellent crystallinity throughout the area, and have excellent utility.

Hereinafter, while embodiments of the present disclosure will be described in more detail with reference to the accompanying examples, it should be noted that examples are not limited to the following.

Preparation of Samples of Examples and Comparative Examples

The powder containing SiC particles were loaded into the internal space of the graphite crucible body, and the SiC seeds and the seed holders were disposed over the powder. The C plane (000-1 plane) of the SiC seed (4H—SiC crystal, 6 inch) was fixed to face the bottom of crucible. The same applies to the following examples and comparative examples.

The crucible main body in which the seeds and the seed holders were installed was covered with a crucible cover, surrounded by a heat insulating material, and then placed into a reaction chamber equipped with a heating coil as a heating means.

A sample of an example was prepared by using a graphite felt having a density of 0.17 g/cc, an air porosity of 83%, and compressive strength of 0.36 MPa, as a heat insulating material, and a sample of a comparative example was prepared by using a graphite felt having a density of 0.13 g/cc, an air porosity of 85%, and compressive strength of 0.19 MPa, as a heat insulating material.

The internal space of the crucible was depressurized to create a vacuum atmosphere, and argon gas was injected to the internal space of the crucible to reach atmospheric pressure, and then the internal space of the crucible was slowly depressurized again. At the same time, the temperature of the internal space of the crucible was gradually raised to 2300° C.

SiC ingot was grown from a SiC seed for 100 hours under a temperature of 2300° C. and a pressure of 20 torr.

A wafer having an omega angle of 13.811 degree based on 4 degree off with respect to the 0001 plane was prepared, and the following measurements were performed.

An Evaluation on the Properties of Examples and Comparative Examples

Using a X-ray path of a high resolution X-ray diffraction analysis system (HR-XRD system), after setting [11-20] direction of the wafer of the examples and comparative examples to the X-ray path and setting X-ray source optic and X-ray detector optic angles to 2θ (35 to 36 degrees), a locking angle was measured by adjusting an omega (ω, or theta θ, X-ray detector optic) angle to the off angle of the wafer. Specifically, the omega angle was 13.811 degree based on 4 degree off.

X-ray power was 9 kW, X-ray target was Cu, and Goniometer resolution was 0.0001 degree. In order to measure the FWHM of the rocking curve for the entire sample surface, full mapping was performed at 10 mm intervals in the X and Y axes, respectively. That is, 154 points were measured on a 6-inch wafer. The results are shown in FIG. 1 (Example) and FIG. 2 (Comparative Example), respectively.

Evaluation Results of the Properties of Examples and Comparative Examples

Figure 1:
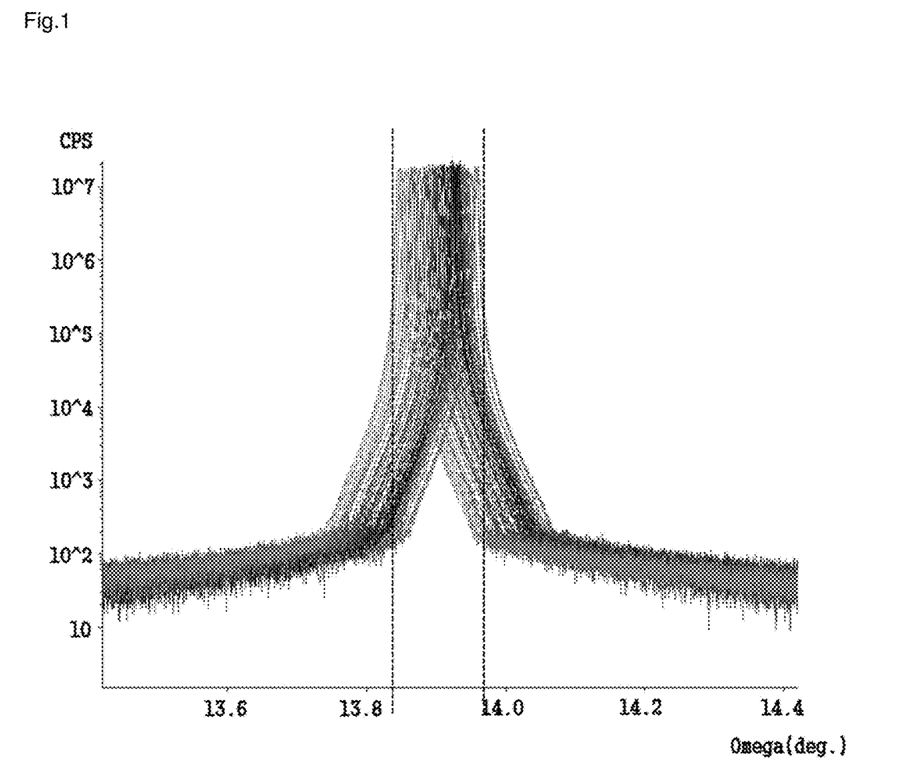
FIG. 1 is a Rocking Curve Graph of Example 1 according to an embodiment.
Figure 2:
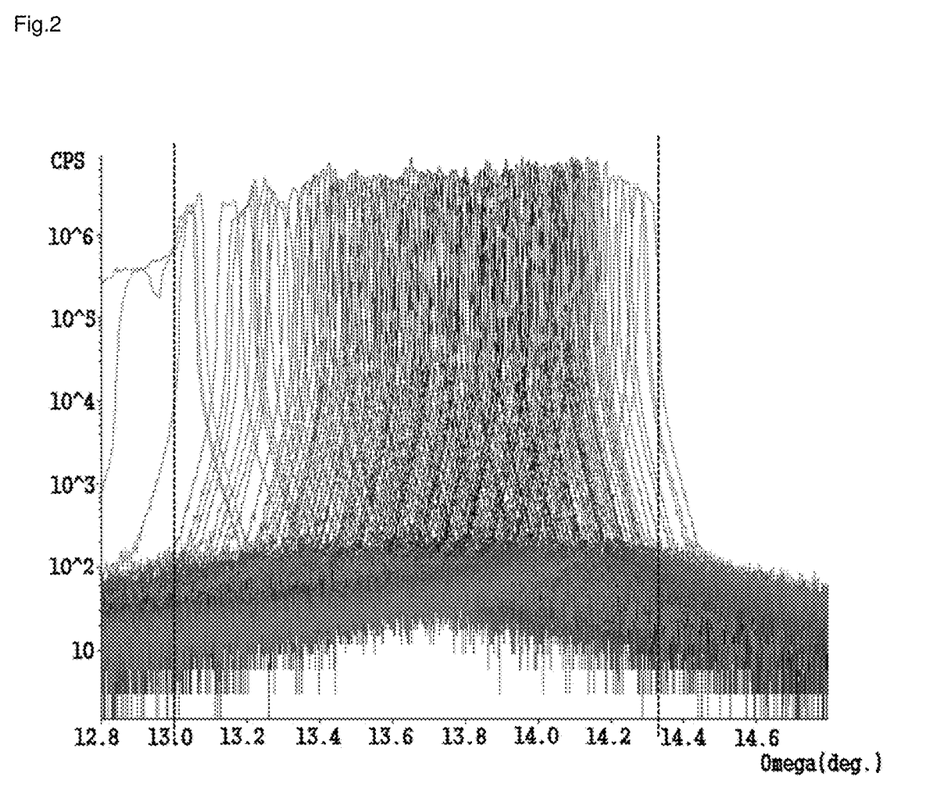
FIG. 2 is a Rocking Curve Graph of Example 2 according to an embodiment.

FIG. 1 is a Rocking Curve Graph of Example 1 according to an embodiment. FIG. 2 is a Rocking Curve Graph of Example 2 according to another embodiment. FIG. 3 is a conceptual view illustrating the target area T and the measuring point P on the wafer W according to an embodiment.

With reference to the figures, the results of evaluation of properties of Examples 1 and 2 will be described below.

The properties of Example 1 were measured on a wafer to which 13.811 degree was applied based on a SiC (004) plane −4° off angle. The area corresponding to 90% radius from the center C of the wafer is set as the target area (T), and the imaginary lines (dotted line in FIG. 3) are drawn at an interval of 10 mm horizontally and vertically. After taking the intersection points as the measuring points (P), the Rocking Curve FWHM of Example 1 were measured at a total of 154 measuring points (refer to the results in FIG. 1).

Based on the average value of the omega angles at the peaks of the measuring points within the target area, the results of the rocking curve FWHM evaluated at each peak are as follows. It was found that 98% were −0.05 to 0.05 degree, 1.5% were −0.5 to −0.05, or 0.05 to 0.5, and 0.5% were −1.0 to −0.5, or 0.5 to 1.0. Less than −1.0 or more than 1.0 were not measured.

In the Example 1, it was confirmed that the peak angle, which is the omega angle at the peak, was located within 13.8 degree to 14.0 degree and distributed within the range of 0.2 degree (refer to the black dotted line in FIG. 1).

The properties of Example 2 were measured on a wafer to which 13.811 degree was applied based on a SiC (004) plane −4° off angle. As in Example 1, the area corresponding to 90% radius from the center C of the wafer is set as the target area (T), and the imaginary lines (dotted line in FIG. 3) are drawn at an interval of 10 mm horizontally and vertically. After taking the intersection points as the measuring points (P), the Rocking Curve FWHM of Example 2 were measured at a total 154 measuring points (refer to the results in FIG. 2).

Based on the average value of the omega angles at the peaks of the measuring points within the target area, the results of the rocking curve FWHM evaluated at each peak are as follows. It was found that 97% were −0.05 to 0.05 degree, 2.5% were −0.5 to −0.05, or 0.05 to 0.5, and 0.5% were −1.0 to −0.5, or 0.5 to 1.0. Less than −1.0 or more than 1.0 were found to be 0%.

In the Example 2, it was confirmed that the peak angle, which is the omega angle at the peak, was located within 13.0 degree to 14.4 degree and distributed within a relatively wide range of 1.4 degree (refer to the black dotted line in FIG. 2).

It was confirmed that Example 1 and Example 2 had excellent crystallinity, and the crystallinity of Example 1 was superior to that of Example 2.

While specific examples have been shown and described above, it will be apparent after an understanding of the disclosure of this application that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. A SiC wafer comprising:
a plurality of measuring points distributed on a surface of the wafer at regular intervals of 10 mm or less; and
a target area on the surface of the wafer inside of a circle having a radius of 70% of a radius of the wafer;
wherein the plurality of measuring points are within the target area,
wherein a rocking curve of the plurality of measuring points has a peak and a full width at half maximum,
wherein an average value of an omega angle is an average of omega angles of the peaks of the plurality of measuring points,
wherein the full width at half maximum is a value based on the average value of the omega angle, and
wherein more than 95% of the plurality of measuring points have the full width at half maximum of −1.5 to 1.5 degree.

2. The SiC wafer of claim 1, wherein more than 96% of the plurality of measuring points have the full width at half maximum of −1.0 to 1.0 degree.

3. The SiC wafer of claim 1, wherein more than 97% of the plurality of measuring points have the full width at half maximum of −0.5 to 0.5 degree.

4. The SiC wafer of claim 1, wherein more than 98% of the plurality of measuring points have the full width at half maximum of −0.05 to 0.05 degree.

5. The SiC wafer of claim 1, wherein the target area comprises one or more measuring point per 1 $cm^2$.

6. The SiC wafer of claim 1, wherein the target area is on the surface of the wafer inside of a circle having a radius of 80% of the radius of the wafer.

7. The SiC wafer of claim 1, comprising:
wherein an omega angle of one of the plurality of measuring points is an omega angle measured at the peak of the one of the plurality of measuring points, and wherein a first measuring point is a point having a maximum omega angle, a second measuring point is a point having a minimum omega angle, and a difference between the omega angle of the first measuring point and the omega angle of the second measuring point is 0.5 degree or less.

\* \* \* \* \*